(12) United States Patent
Yanagita et al.

(10) Patent No.: US 11,186,238 B2
(45) Date of Patent: Nov. 30, 2021

(54) ELECTRONIC MODULE

(71) Applicant: Sumitomo Wiring Systems, Ltd., Mie (JP)

(72) Inventors: Yoshiki Yanagita, Mie (JP); Takumi Ejima, Mie (JP)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 11 days.

(21) Appl. No.: 16/786,000

(22) Filed: Feb. 10, 2020

(65) Prior Publication Data
US 2020/0269777 A1  Aug. 27, 2020

(30) Foreign Application Priority Data

Feb. 26, 2019 (JP) .............................. JP2019-032983

(51) Int. Cl.
*B60R 16/02*   (2006.01)
*H02G 5/02*    (2006.01)
*H05K 5/02*    (2006.01)
*B60R 16/023*  (2006.01)

(52) U.S. Cl.
CPC .............. *B60R 16/02* (2013.01); *H02G 5/02* (2013.01); *H05K 5/0217* (2013.01); *B60R 16/0239* (2013.01)

(58) Field of Classification Search
CPC ....... B60L 3/00; B60R 16/02; B60R 16/0239; B60Y 2304/07; H01H 45/04; H01H 45/12; H02G 3/16; H02G 5/02; H05K 5/0217; H05K 5/02; H05K 5/0204; H05K 7/20

USPC ........................................ 361/807; 439/76.2
See application file for complete search history.

(56) References Cited

U.S. PATENT DOCUMENTS

| | | | |
|---|---|---|---|
| 5,023,752 A * | 6/1991 | Detter ................. | B60R 16/0238 361/646 |
| 2005/0026471 A1* | 2/2005 | Kobayashi ............. | H01R 9/223 439/76.2 |
| 2005/0153583 A1* | 7/2005 | Kawamura .......... | H01R 9/2458 439/76.2 |
| 2010/0216336 A1* | 8/2010 | Quiter .................. | H01R 4/4809 439/567 |
| 2020/0067066 A1* | 2/2020 | Kim ..................... | H01M 50/543 |

FOREIGN PATENT DOCUMENTS

JP          2014-079093        5/2014

* cited by examiner

*Primary Examiner* — Timothy J Thompson
*Assistant Examiner* — Guillermo J Egoavil
(74) *Attorney, Agent, or Firm* — Honigman LLP

(57) ABSTRACT

Provided is an electronic module with which electrical connection with an electronic component attached to the electronic module can be stabilized. A vehicle electronic module including a casing that includes a ceiling plate to which an electronic components is to be attached and a bottom plate that is located opposite to the ceiling plate includes a bus bar configured to be electrically connected to a relay terminal of the electronic component inserted into the casing, and the bus bar is movable together with the electronic component in the opposing direction of the ceiling plate and the bottom plate.

4 Claims, 10 Drawing Sheets

ELECTRONIC MODULE

CROSS-REFERENCE TO RELATED APPLICATIONS

This application claims priority of Japanese Patent Application No. JP 2019-032983 filed on Feb. 26, 2019, the contents of which are incorporated herein.

TECHNICAL FIELD

The present disclosure relates to a vehicle electronic module that includes a casing to which an electronic component is to be attached.

BACKGROUND ART

Conventionally, an electronic module to which electronic components such as a relay are attached is mounted on a vehicle.

JP 2014-79093A discloses a power supply device including a relay that includes a contact capable of being opened and closed and an exciting coil for switching opening/closing of the contact. By electrically connecting the contact of the relay to a bus bar, and providing the bus bar with a heat dissipation mechanism, the bus bar can be used as both a current path and a heat dissipation path, and the heat dissipation properties of the relay can be improved.

JP 2014-79093A is an example of related art.

SUMMARY OF THE INVENTION

In the above-described power supply device, an electronic component such as the relay is detachable, and accordingly a connection terminal of the electronic component is not fixed to the bus bar. Therefore, there is a risk that, if the power supply device or the electronic component vibrates, frictional heat will be generated as a result of a contact portion of the bus bar sliding against the connection terminal of the electronic component, and the electrical resistance between the bus bar and the connection terminal of the electronic component will increase.

However, the power supply device disclosed in JP 2014-79093A is not configured taking such a problem into consideration, and cannot solve such a problem.

The present disclosure has been made in view of the above circumstances, and it is an object of the disclosure to provide an electronic module with which electrical connection with an electronic component that is attached to the electronic module can be stabilized.

An electronic module according to an embodiment of the present disclosure is an electronic module for a vehicle, including a casing that includes a first plate portion to which an electronic component is to be attached and a second plate portion that is located opposite to the first plate portion and a bus bar configured to be electrically connected to a terminal of the electronic component that is inserted into the casing, wherein the bus bar is movable together with the electronic component in an opposing direction in which the first plate portion and the second plate portion are located opposite to each other.

According to the present disclosure, it is possible to provide an electronic module with which electrical connection with an electronic component attached to the electronic module can be stabilized.

DETAILED DESCRIPTION OF PREFERRED EMBODIMENTS

Figure 1:
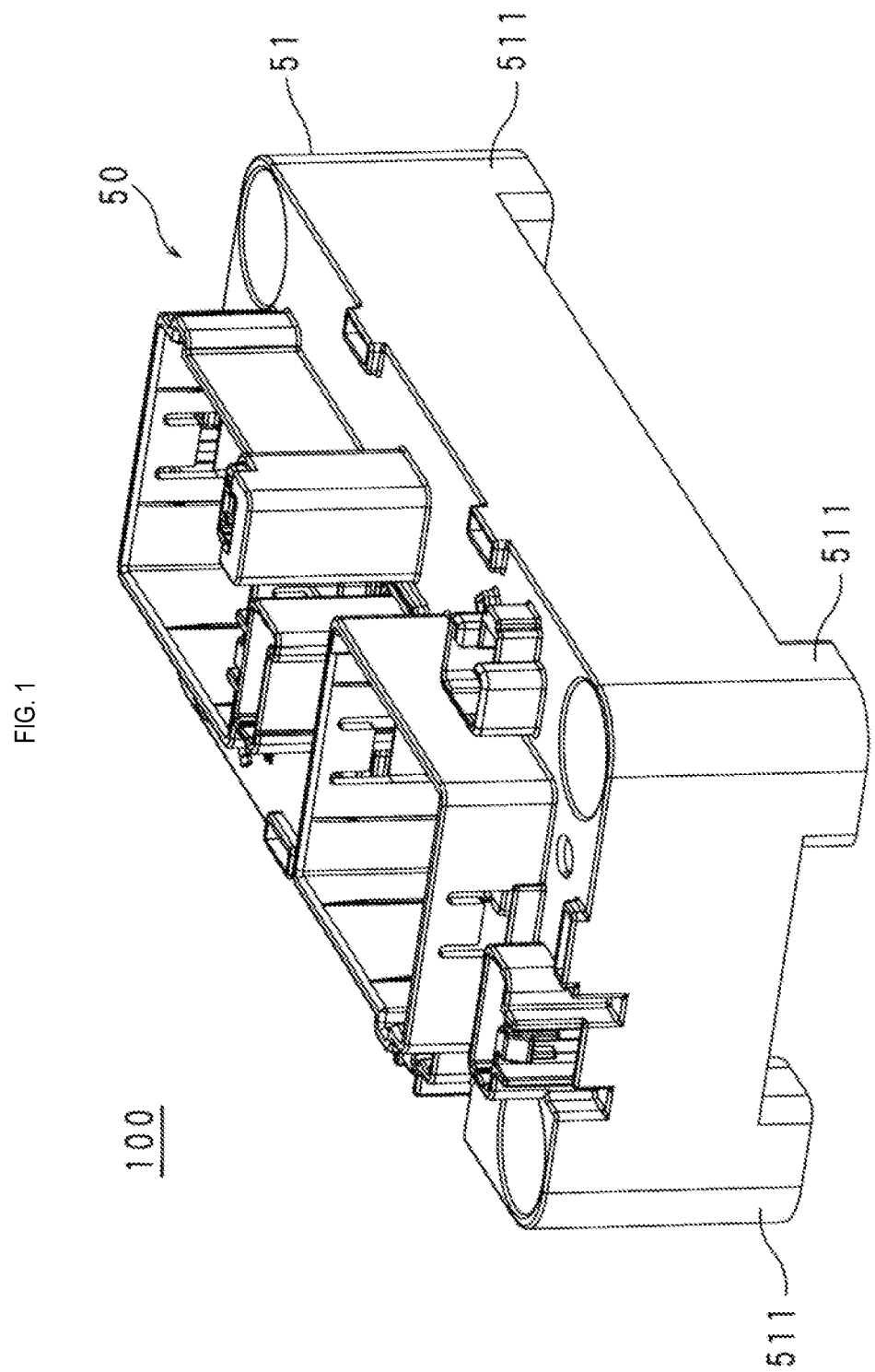
FIG. 1 is a perspective view showing an electronic module according to an embodiment of the present disclosure.

First, embodiments of the present disclosure will be listed and described. At least some of the embodiments described below may be combined freely.

An electronic module according to an embodiment of the present disclosure is an electronic module for a vehicle, including a casing that includes a first plate portion to which an electronic component is to be attached and a second plate portion that is located opposite to the first plate portion and a bus bar configured to be electrically connected to a terminal of the electronic component that is inserted into the casing, wherein the bus bar is movable together with the electronic component in an opposing direction in which the first plate portion and the second plate portion are located opposite to each other.

In this embodiment, the bus bar configured to be electrically connected to the terminal of the electronic component inserted into the casing is movable together with the electronic component. Therefore, shifting of a contact point of the bus bar that is in contact with the electronic component, which occurs if the bus bar slides against the terminal of the electronic component due to vibration of the electronic component, for example, does not occur and an increase in the electrical resistance due to heat generated through such sliding can be prevented.

An electronic module according to an embodiment of the present disclosure includes an attachment recess that is provided in the first plate portion and to which the electronic component is to be attached and an engagement hole that is formed in the attachment recess and is configured to engage with an engagement claw of the electronic component, wherein, in a state in which the electronic component is in contact with a bottom of the attachment recess, a distance between the engagement claw of the electronic component and an edge of the engagement hole in the opposing direction is equal to or smaller than a movable distance of the bus bar.

In this embodiment, the distance between the engagement claw of the electronic component and the edge of the engagement hole provided in the attachment recess to which the electronic component is attached, that is, the range within which the electronic component moves when vibrating, is equal to or smaller than the movable distance of the bus bar. Accordingly, the bus bar is movable together with the electronic component when the electronic component vibrates, and the above-described shifting of the contact point does not occur, and it is possible to prevent an increase in the electrical resistance due to heat generated through friction, which occurs if the contact point shifts.

In an electronic module according to an embodiment of the present disclosure, the movable distance of the bus bar is 1 to 1.3 times the distance between the engagement claw of the electronic component and the engagement hole.

In this embodiment, the movable distance of the bus bar is 1 to 1.3 times the distance between the engagement claw of the electronic component and the engagement hole in the casing, that is, the range within which the electronic component moves when vibrating. Accordingly, the bus bar is movable together with the electronic component when the electronic component vibrates, and the above-described shifting of the contact point does not occur, and an increase in the electrical resistance can be prevented.

In an electronic module according to an embodiment of the present disclosure, the bus bar includes one end portion that has a U-shape and pinches the terminal of the electronic component.

In this embodiment, the one end portion of the bus bar has a U-shape and pinches the terminal of the electronic component. Therefore, the bus bar can be reliably connected to the terminal of the electronic component, and even if the electronic component vibrates, the contact point of the bus bar that is in contact with the electronic component does not slide against the terminal of the electronic component, and it is possible to prevent an increase in the electrical resistance due to heat generated through friction between the bus bar (one end portion) and the terminal of the electronic component.

In an electronic module according to an embodiment of the present disclosure, the one end portion of the bus bar includes a protruding portion that comes into contact with the terminal of the electronic component, and the terminal of the electronic component has a recess or a protrusion.

In this embodiment, the terminal of the electronic component is provided with a recess or a protrusion. Therefore, when the electronic component vibrates, the protruding portion of the bus bar is caught in the recess or on the protrusion and is prevented from sliding. Thus, it is possible to prevent an increase in the electrical resistance due to the generation of heat through friction between the bus bar (one end portion) and the terminal of the electronic component.

Electronic modules according to embodiments of the present disclosure will be described below with reference to the drawings. Note that the present disclosure is not limited to these examples, but is defined by the claims, and is intended to encompass all modifications within the meanings and scope that are equivalent to the claims.

In the embodiments of the present disclosure described below, an exemplary vehicle electronic module to which, for example, a relay is attached as an electronic component will be described.

Embodiment 1

Figure 2:
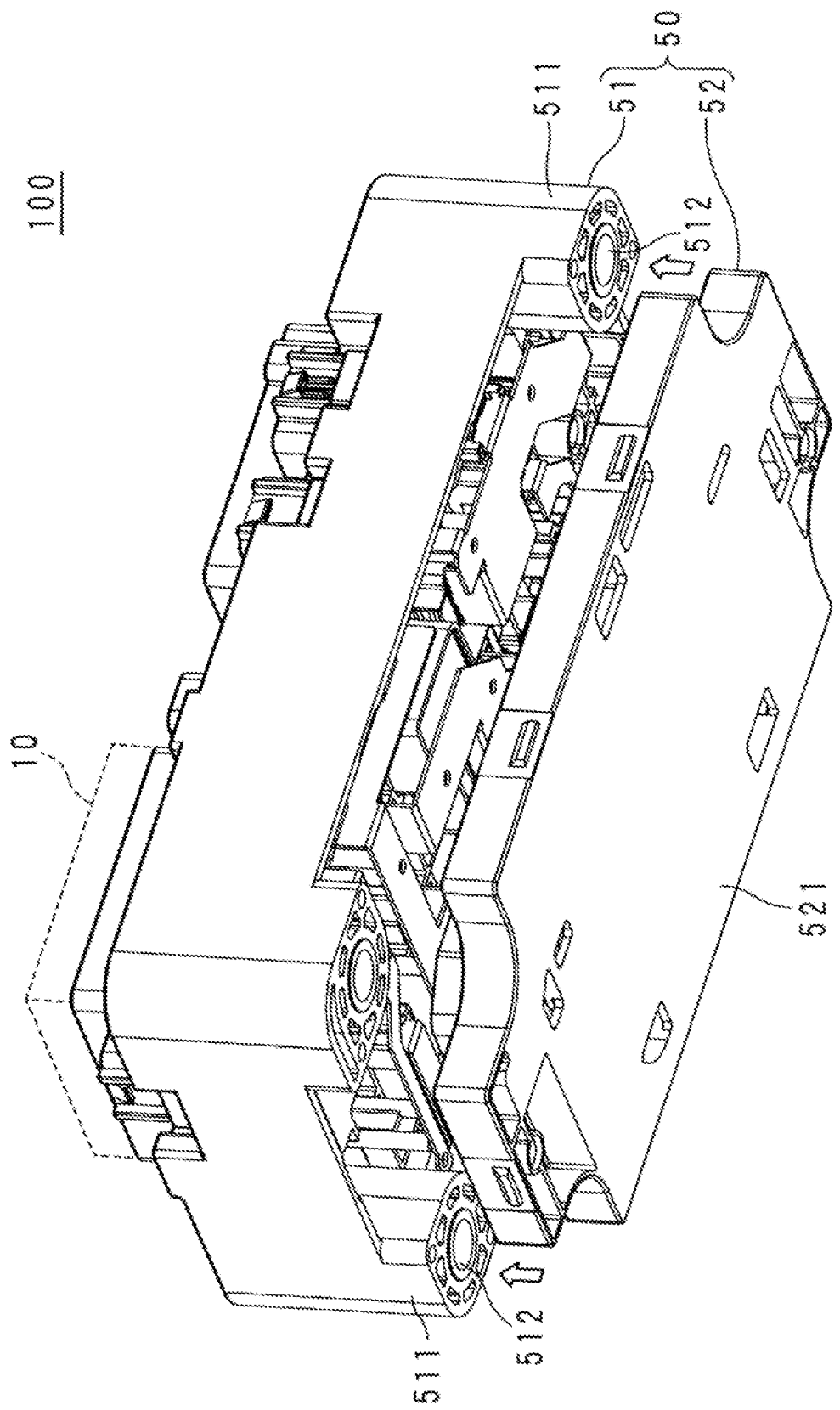
FIG. 2 is a partial exploded view of the electronic module according to an embodiment of the present disclosure.
Figure 3:
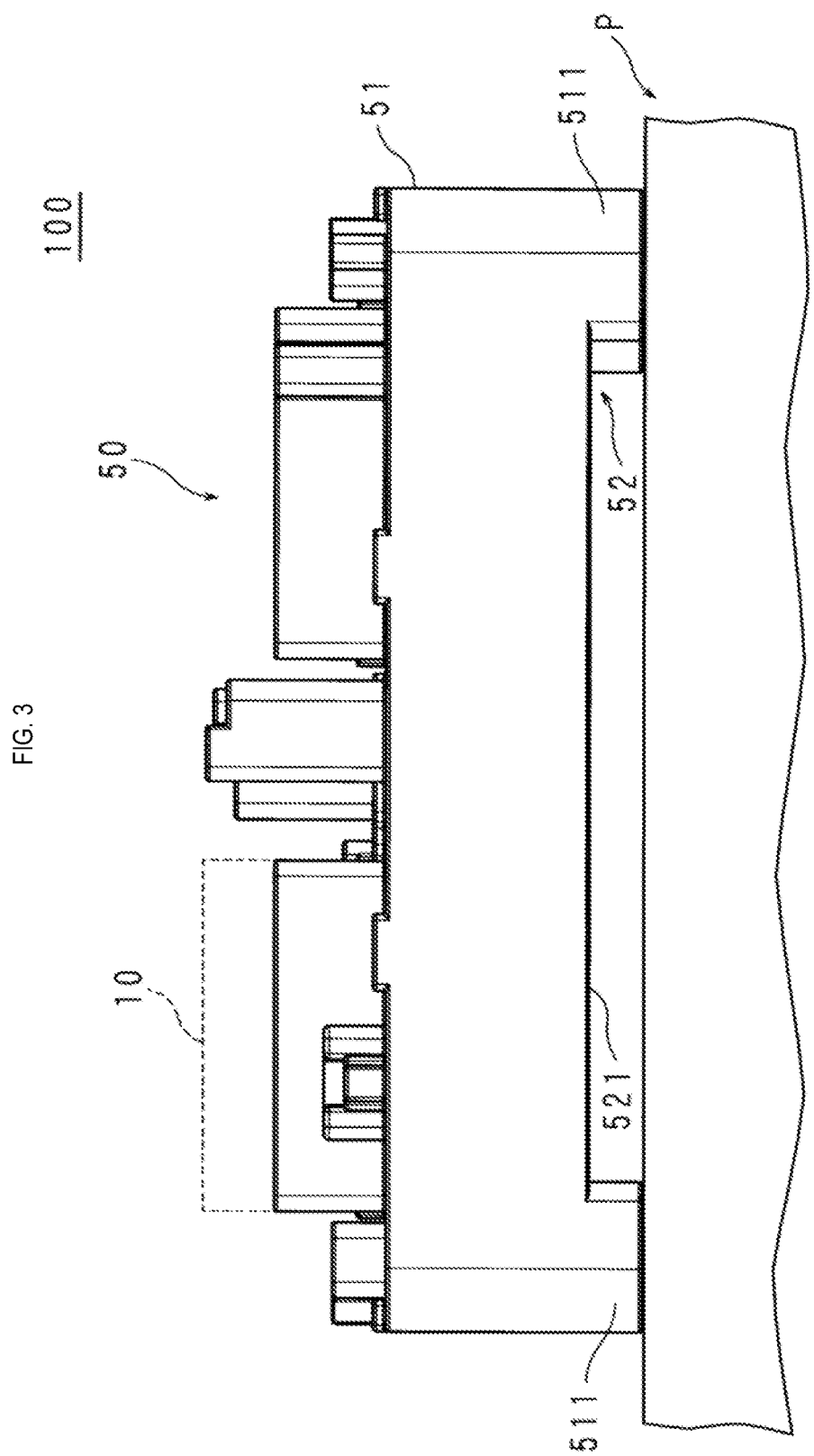
FIG. 3 is a side view showing the electronic module according to an embodiment of the present disclosure.

FIG. 1 is a perspective view showing an electronic module 100 according to the present embodiment, FIG. 2 is a partial exploded view of the electronic module 100 according to the present embodiment, and FIG. 3 is a side view showing the electronic module 100 according to the present embodiment.

The electronic module 100 is attached to an outer side of a battery pack P (object) of an electric vehicle (EV), for example. The electronic module 100 includes a casing 50 to which a relay 10 is attached, for example. For example, the relay 10 is switched on in a state in which the vehicle is caused to travel, and is switched off in a state in which the vehicle is not caused to travel.

The casing 50 is made of ZYLON (registered trademark), for example, and includes a lower case 52 and an upper case 51 that covers the lower case 52. The casing 50 is attached to the battery pack P such that a bottom plate 521 (second plate portion) of the lower case 52 faces the battery pack P. More specifically, a leg portion 511 having a bottomed tubular shape is provided at each of the four corners of the upper case 51, and a through hole 512 is formed in the bottom of each of the leg portions 511. The casing 50 (electronic module 100) can be attached to the battery pack P by, for example, passing screws through the through holes 512 of the leg portions 511, and threadably engaging the screws with the battery pack P.

At this time, the bottom plate 521 of the lower case 52 of the electronic module 100 faces the outer surface of the battery pack P. For the sake of convenience of the following description, the direction in which the electronic module 100 and the battery pack P face each other will be referred to as the up-down direction. That is, the electronic module 100 side will be referred to as the upper side, and the battery pack P side will be referred to as the lower side.

Figure 4:
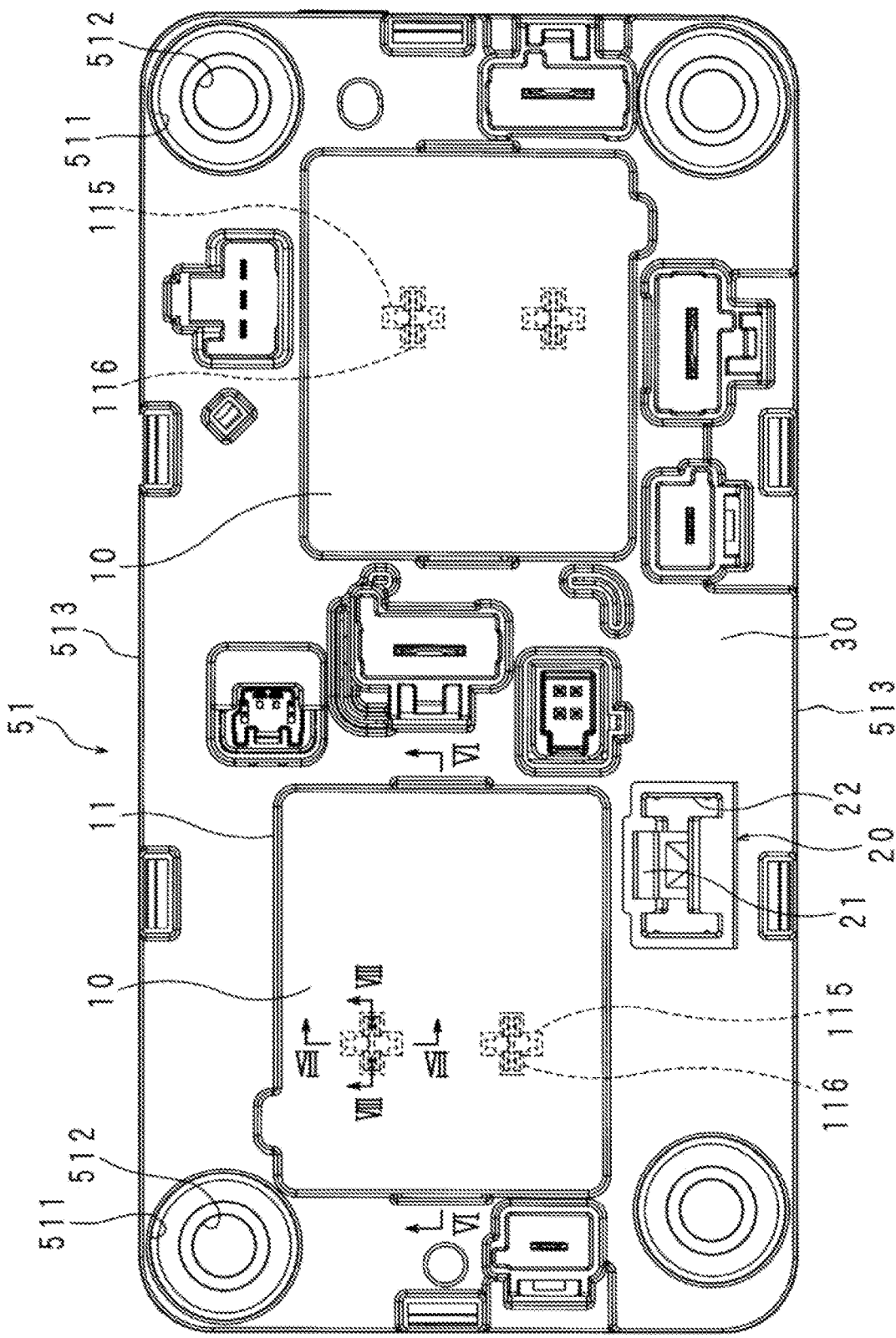
FIG. 4 is a plan view of an upper case of the electronic module according to an embodiment of the present disclosure.
Figure 5:
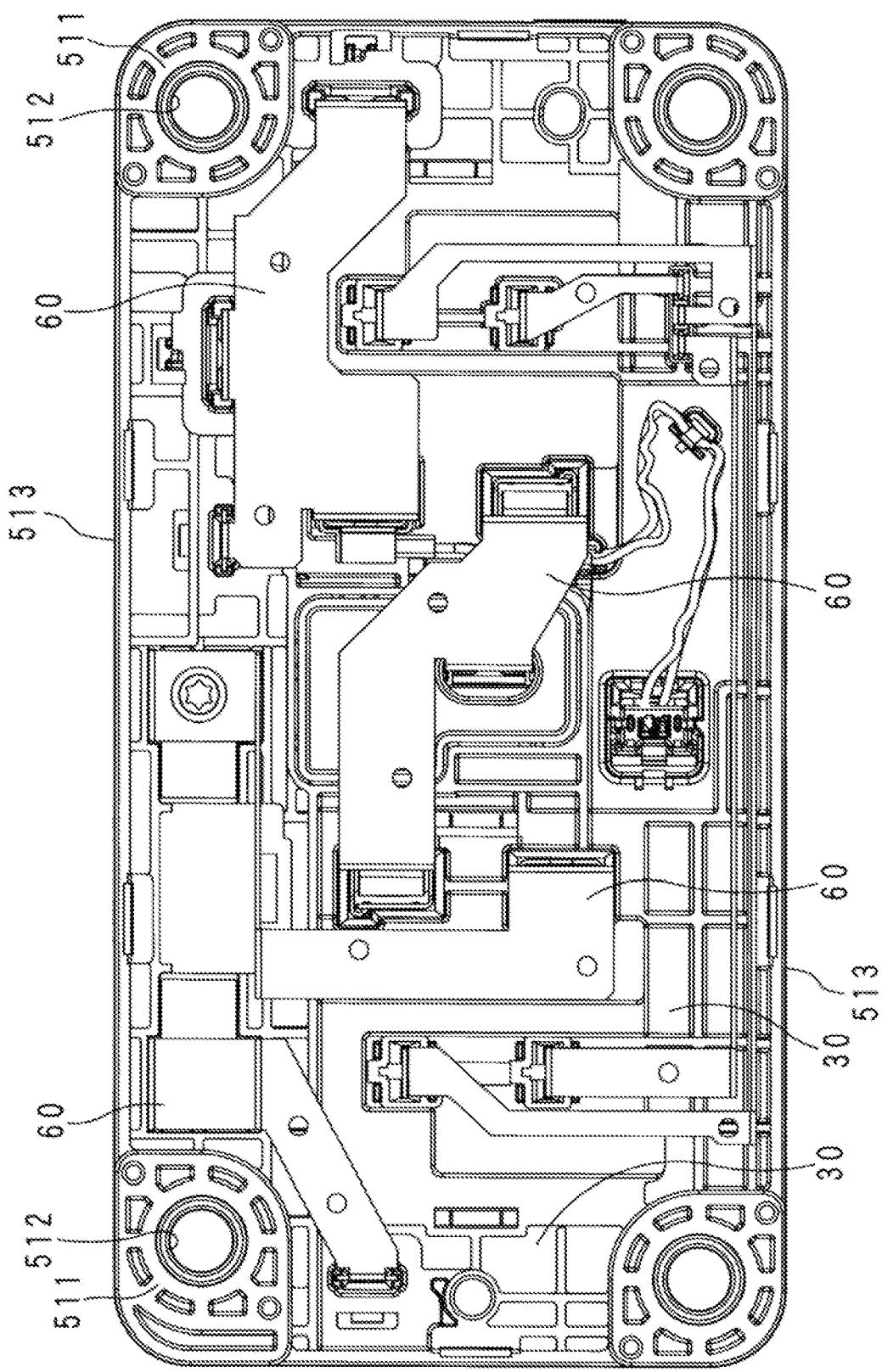
FIG. 5 is a bottom view of the upper case of the electronic module according to an embodiment of the present disclosure.

FIG. 4 is a plan view of the upper case 51 of the electronic module 100 according to the present embodiment, and FIG. 5 is a bottom view of the upper case 51 of the electronic module 100 according to the present embodiment. For the sake of convenience of description, FIG. 4 shows a case in which relays 10 are attached to the upper case 51.

The upper case 51 has the shape of a flat casing with one surface open, and a plurality of bus bars 60, fuse portions (not shown), and so forth are arranged inside the upper case 51.

The upper case 51 includes a ceiling plate 30 (first plate portion) that is located opposite to the bottom plate 521 of the lower case 52. The ceiling plate 30 has a substantially rectangular shape, and a leg portion 511 protrudes from each of the four corners of the ceiling plate 30 to the lower case 52 side. A peripheral wall portion 513 extends from a peripheral edge of the ceiling plate 30 to the lower case 52 side.

Attachment recesses 11 for attaching the relays 10 are provided in the outer surface of the ceiling plate 30. Each attachment recess 11 has a bottomed tubular shape and has a rectangular shape in plan view. The bottom of the attachment recess 11 has a through hole through which a relay terminal 101 (see FIG. 7) that is provided on a lower surface of the relay 10 is to be passed. The through hole has a cross shape in plan view and extends through the upper case 51 from the inside to the outside thereof. Two through holes are formed in the bottom of each attachment recess 11. The relay terminal 101 is passed through a rectangular through hole 115 that extends in an arrangement direction in which the two through holes are arranged side by side.

Also, a rectangular through hole 116 that extends in a direction that intersects the through hole 115 is provided, and the through hole 115 and the through hole 116 together form a cross shape.

On the ceiling plate 30, a connection portion 20 that is to be connected to an external connector is provided in the vicinity of an edge thereof, or in other words, toward the peripheral wall portion 513 relative to the center. The connection portion 20 includes a connection terminal 21 and an insertion hole 22.

A terminal is provided inside a housing of the external connector, and when the connector is inserted into the connection portion 20, the housing engages with the insertion hole 22, and the terminal inside the housing is electrically connected to the connection terminal 21.

On a plurality of portions of the inner surface of the ceiling plate 30, ribs are provided, and a plurality of pedestals for attaching the bus bars 60, fuse portions, and so forth are provided. The bus bars 60 and the fuse portions are attached to the pedestals.

Figure 6:
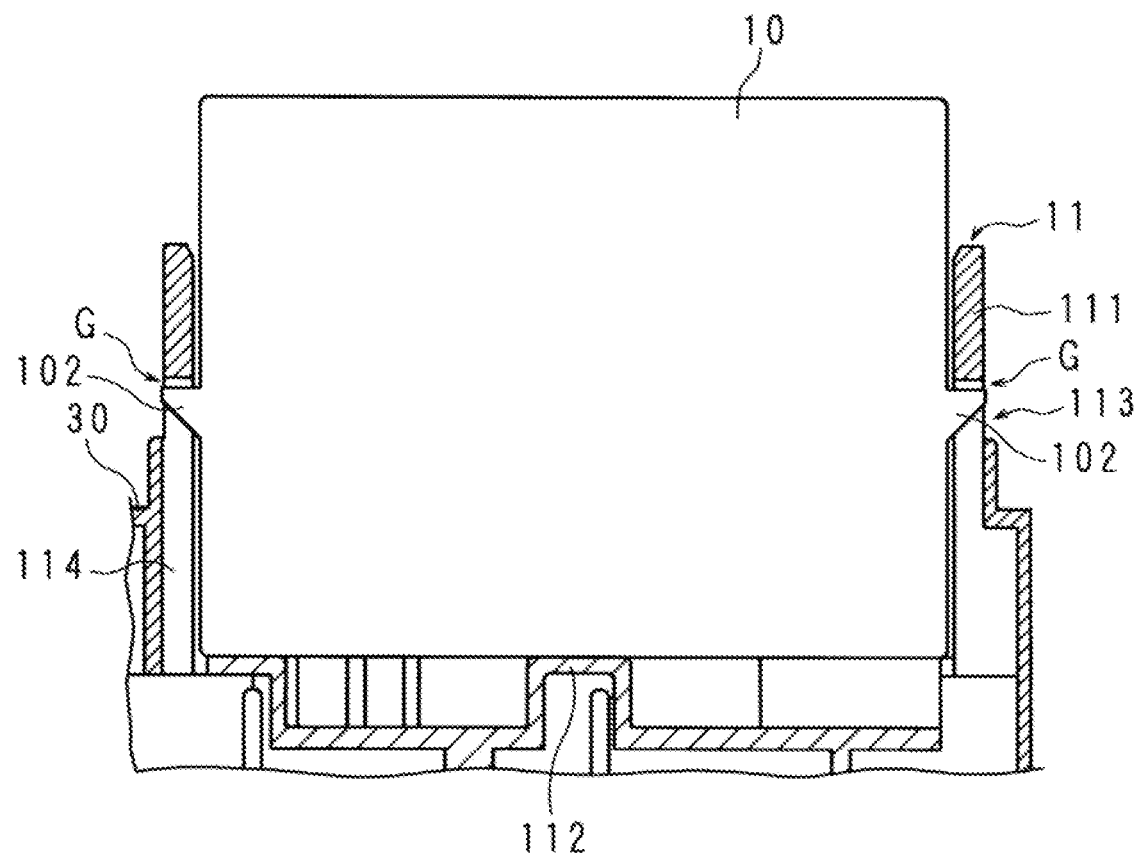
FIG. 6 is a longitudinal cross-sectional view taken along line VI-VI in FIG. 4.
Figure 7:
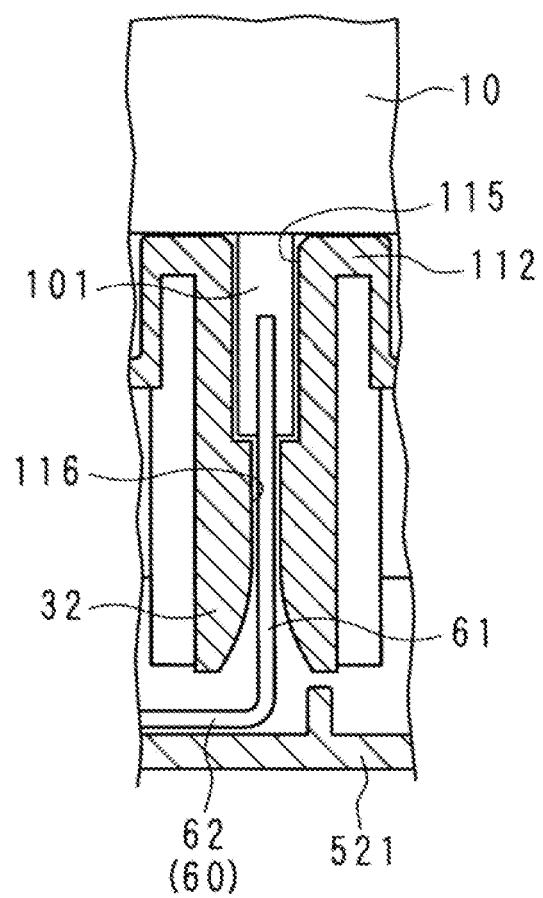
FIG. 7 is a longitudinal cross-sectional view taken along line VII-VII in FIG. 4.
Figure 8:
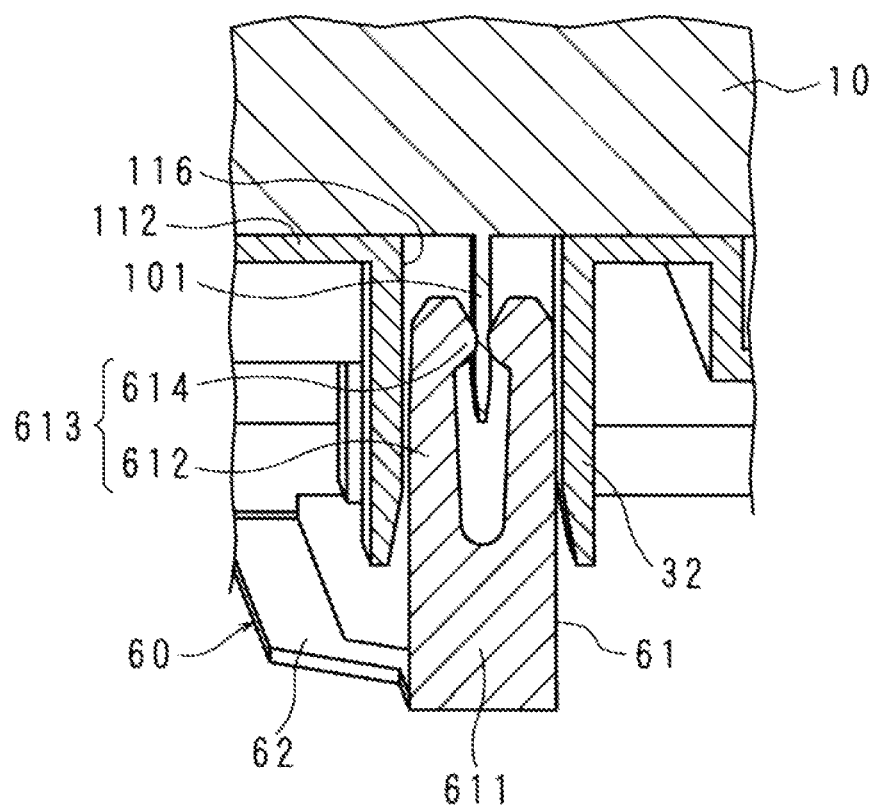
FIG. 8 is a longitudinal cross-sectional view taken along line VIII-VIII in FIG. 4.

FIG. 6 is a longitudinal cross-sectional view taken along line VI-VI in FIG. 4, FIG. 7 is a longitudinal cross-sectional view taken along line VII-VII in FIG. 4, and FIG. 8 is a longitudinal cross-sectional view taken along line VIII-VIII in FIG. 4.

Each attachment recess 11 includes an attachment seat 114 that is a recess formed in the ceiling plate 30 and a rectangular tube-shaped guide tube 111 that is provided along the peripheral edge of the attachment seat 114. The guide tube 111 stands upright in a direction that intersects the ceiling plate 30. The through hole 115 and the through hole 116 are formed in the bottom of the attachment seat 114 so as to cross each other as described above.

The relay 10 is inserted into the attachment seat 114 while being guided by the guide tube 111. At this time, the relay terminal 101 of the relay 10 is inserted into the upper case 51 (casing 50) via the through hole 115 and is electrically connected to one of the bus bars 60.

The relay 10 has engagement claws 102 that protrude respectively from one side surface and another side surface of the relay 10 that are opposite to each other. The engagement claws 102 are provided in substantially central portions of the one side surface and the other side surface.

The attachment recess 11 has engagement holes 113 that are formed at positions that correspond to the engagement claws 102 of the relay 10 when the relay 10 is attached to the attachment recess 11. Specifically, the engagement holes 113 are formed in the guide tube 111 of the attachment recess 11 and extend through the guide tube 111 from the inside to the outside thereof.

In the opposing direction of the one side surface and the other side surface of the relay 10, the distance between inner side surfaces of the guide tube 111 is equal to the length between the one side surface and the other side surface of the relay 10. That is, in the opposing direction, the length from a leading end of the engagement claw 102 provided on the one side surface to a leading end of the engagement claw 102 provided on the other side surface is longer than the distance between the inner side surfaces of the guide tube 111.

Accordingly, when attaching the relay 10, the relay 10 is pressed into the guide tube 111 and the two engagement claws 102 of the relay 10 respectively engage with the engagement holes 113 of the guide tube 111. Thus, upward movement of the relay 10 is restricted, and even if vibration is applied to the electronic module 100, the relay 10 is not detached from the attachment recess 11.

On the inner surface of the ceiling plate 30, a connection tube 32 is provided extending in the up-down direction at a position that matches the through hole 115 and the through hole 116. The connection tube 32 protrudes in a direction that intersects the inner surface of the ceiling plate 30. Holes that respectively have shapes conforming to the through hole 115 and the through hole 116 and extend in the longitudinal direction of the connection tube 32 are formed in the connection tube 32.

That is, the through hole 115 and the through hole 116 formed in the attachment seat 114 are in communication with the holes formed in the connection tube 32. The hole that has a shape conforming to the through hole 116 is formed so as to penetrate through the connection tube 32 in its longitudinal direction, that is, in the up-down direction, and the hole that has a shape conforming to the through hole 115 is formed only in an upper end portion of the connection tube 32.

In other words, a hole that has a cross shape in a transverse cross-sectional view is formed in the upper end portion of the connection tube 32, and a hole that has the shape of a slot in a transverse cross-sectional view is formed in a lower end portion of the connection tube 32.

For the sake of convenience of the following description, the hole in the connection tube 32 that has a shape conforming to the through hole 115 will also be referred to as the through hole 115, and the hole in the connection tube 32 that has a shape conforming to the through hole 116 will also be referred to as the through hole 116.

As described above, the relay terminal 101 of the relay 10 is inserted into the through hole 115. The relay terminal 101 has an elongated rectangular shape, and the length of the through hole 115 in the connection tube 32 is substantially the same as the length of the relay terminal 101.

The bus bar 60 is provided using a conductive metal plate material and includes a polygonal flat portion 62 and a connection end portion 61 that is bent in a direction that intersects the flat portion 62. The connection end portion 61 is inserted into the through hole 116 in the connection tube 32 and is connected to the relay terminal 101.

The connection end portion 61 has a U-shape. The connection end portion 61 includes a base plate 611 that extends from the flat portion 62 and two arm plates 613 that extend from opposite end portions of an edge of the base plate 611, along surfaces of the base plate 611. The arm plates 613 are appropriately spaced from each other by a predetermined distance in an arrangement direction thereof. The base plate 611 and the arm plates 613 are formed as a single piece so as to be flush with each other.

Figure 9:
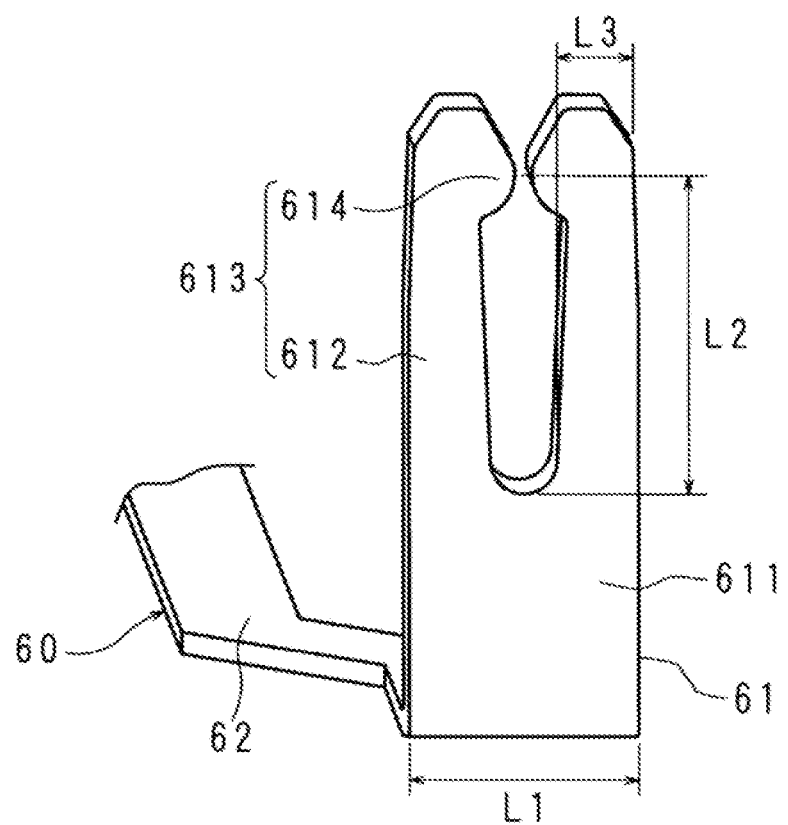
FIG. 9 is an enlarged view of a contact end portion of a bus bar in the electronic module according to an embodiment of the present disclosure.

FIG. 9 is an enlarged view of the connection end portion 61 of the bus bar 60 included in the electronic module 100 according to the present embodiment.

Side surfaces of the base plate 611 on opposite end sides thereof in the arrangement direction of the two arm plates 613 are flush with side surfaces of the respective arm plates 613. In the following description, these side surfaces of the arm plates 613 will be referred to as outer side surfaces. Also, side surfaces of the respective arm plates 613 that face each other will be referred to as inner side surfaces.

Each arm plate 613 includes a narrow portion 612 in which the width thereof decreases in a direction from the edge of the base plate 611 toward a protruding end of the arm plate and a substantially circular wide portion 614 (protruding portion) that is provided at an end of the narrow portion 612. As the narrow portion 612 approaches the protruding end, the above-described inner side surface approaches the above-described outer side surface and the width of the narrow portion 612 decreases. In other words, the inner side surfaces of the two narrow portions 612 are more distanced from each other as the narrow portions 612 approach the protruding ends. The inner side surfaces of the narrow portions 612 are R-chamfered at the edge of the base plate 611.

On the other hand, in the arrangement direction of the two arm plates 613, the wide portions 614 are wider than the narrow portions 612. One wide portion 614 protrudes toward the other wide portion 614. In other words, the distance between the inner side surfaces of the two arm plates 613 gradually increases at the narrow portions 612 and sharply decreases at the wide portions 614.

As a result of the two wide portions 614 of the connection end portion 61 pinching the relay terminal 101 of the relay 10, the bus bar 60 is electrically connected to the relay terminal 101. The portion of one wide portion 614 that protrudes closest to the other wide portion 614 serves as a contact point that comes into contact with the relay terminal 101.

For example, the distance (L2) from the edge of the base plate 611, that is, the base end of the narrow portion 612, to the contact point of the wide portion 614 is 1.39 times the length (L1) of the base plate 611 in the arrangement direction of the two arm plates 613, and the width (L3) of the narrow portion 612 at its base end is 0.35 times the length L1.

The connection end portion 61 having such a shape pinches the relay terminal 101 with a pinching force of at least 20.4 N. As a result of the connection end portion 61 having the pinching force of at least 20.4 N, the bus bar 60 can maintain the state of being connected to the relay terminal 101 against its own weight.

That is, if the relay 10 moves up and down, the bus bar 60 also moves up and down together with the relay terminal 101 in a state in which the connection end portion 61 is pinching the relay terminal 101.

The length (L1) of the base plate 611 in the arrangement direction of the arm plates 613, that is, the distance between the outer side surfaces of the arm plates 613 is shorter than the length of the through hole 116 in its longitudinal direction in a transverse cross-sectional view. Further, the thickness of the connection end portion 61 is smaller than the length of the through hole 116 in its short direction in a transverse cross-sectional view. That is, the connection end portion 61 can freely move up and down within the through hole 116 in the connection tube 32.

Furthermore, each bus bar 60 is positioned merely by inserting the connection end portion 61 into the connection tube 32 from the inner side of the ceiling plate 30, and is not fixed to the ceiling plate 30 or the upper case 51. That is, each bus bar 60 can freely move up and down while being guided by the through hole 116 in the connection tube 32.

On the other hand, as shown in FIG. 6, when the relay 10 is attached to the attachment recess 11 and is brought into contact with the bottom of the attachment recess 11 (attachment seat 114), there is a gap G in the up-down direction between the engagement claws 102 of the relay 10 and edges of the engagement holes 113. That is, when the relay 10 is attached to the attachment recess 11, the relay 10 can move upward only by the length of the gap G. Accordingly, if vibration is applied from the outside to the electronic module 100, the relay 10 vibrates in the up-down direction.

If the electronic module 100 (relay 10) vibrates as described above, there is a risk that the connection end portion 61 will slide against the relay terminal 101 of the relay 10 under the weight of the bus bar 60. If the connection end portion 61 of the bus bar 60 slides against the relay terminal 101, there is a problem in that the contact point between the relay terminal 101 and the connection end portion 61 shifts and frictional heat is generated, and accordingly the electrical resistance increases.

The electronic module 100 according to the present embodiment is configured to solve such a problem.

First, in the electronic module 100 according to the present embodiment, the connection end portion 61 pinches the relay terminal 101 with a pinching force of at least a threshold value with which the connection end portion 61 can withstand the weight of the bus bar 60, as described above. Thus, the electronic module 100 is configured such that the bus bar 60 moves up and down together with the relay 10 when the electronic module 100 (relay 10) vibrates.

Furthermore, as described above, the size of the connection end portion 61 is smaller than the size of the through hole 116 in the connection tube 32, and the connection end portion 61 can freely move up and down within the through hole 116 in the connection tube 32 in a state in which the connection end portion 61 is pinching the relay terminal 101.

Furthermore, the movable distance of the bus bar 60 in the up-down direction is larger than the gap G between the engagement claws 102 of the relay 10 and the edges of the engagement holes 113.

As described above, the pedestals, the ribs, the connection tube 32, and so forth protrude from the inner surface of the ceiling plate 30. The bus bar 60 can move between the bottom plate 521 of the lower case 52 and a protruding member (longest member) that is the longest in the up-down direction among these protruding members, in other words, a protruding end of the protruding member that is the closest to the lower case 52.

That is, the movable distance of the bus bar 60 is a value that is obtained by subtracting the thickness of the bus bar 60 (flat portion 62) from the distance between the protruding end of the longest member and the bottom plate 521 of the lower case 52.

As described above, the connection end portion 61 pinches the relay terminal 101 with a pinching force of at least a threshold value with which the connection end portion 61 can withstand the weight of the bus bar 60, the size of the connection end portion 61 is smaller than the size of the through hole 116 in the connection tube 32, and the movable distance of the bus bar 60 is larger than the gap G between the engagement claws 102 of the relay 10 and the edges of the engagement holes 113.

Therefore, in the electronic module 100 according to the present embodiment, when the electronic module 100 (relay 10) vibrates, the bus bar 60 moves up and down together with the relay 10 in a state in which the connection end portion 61 is pinching the relay terminal 101. Accordingly, the connection end portion 61 of the bus bar 60 does not slide against the relay terminal 101, and the generation of frictional heat at the contact point between the relay terminal 101 and the connection end portion 61 can be prevented, and therefore the electrical contact between the relay terminal 101 and the connection end portion 61 is stabilized.

The movable distance of the bus bar 60 is, for example, 1 to 1.3 times the length of the gap G between the engagement claws 102 of the relay 10 and the edges of the engagement holes 113, and is preferably 1.2 times the length of the gap G. This is because, if the movable distance of the bus bar 60 is too long, it is difficult to make the electronic module 100 compact.

Embodiment 2

Figure 10:
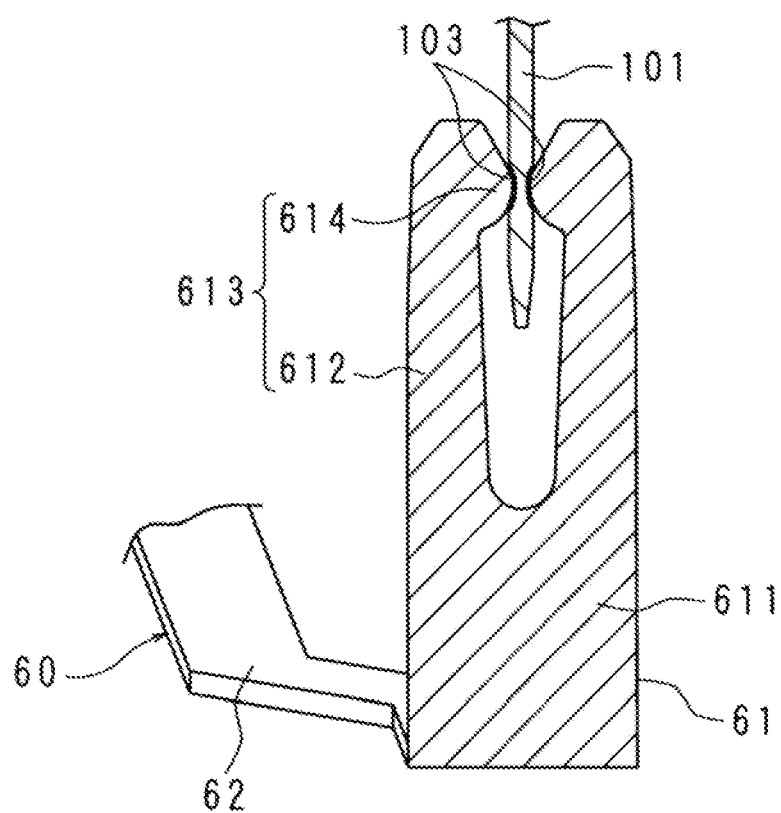
FIG. 10 is a schematic longitudinal cross-sectional view showing a state in which a relay terminal is pinched by the contact end portion in an electronic module according to an embodiment of the present disclosure.

FIG. 10 is a schematic longitudinal cross-sectional view showing a state in which the relay terminal 101 is pinched by the contact end portion 61 in the electronic module 100 according to the present embodiment.

In the electronic module 100 according to the present embodiment, the relay terminal 101 of the relay 10 is provided with a recess or a protrusion. For the sake of convenience of description, FIG. 10 shows an example in which recesses 103 are respectively formed in opposite surfaces of the relay terminal 101.

As a result of the recesses 103 being formed in the relay terminal 101 as described above, the connection end portion 61 of the bus bar 60 can more reliably pinch the relay terminal 101, and even if the electronic module 100 (relay 10) vibrates, the connection end portion 61 does not slide against the relay terminal 101.

Although an example in which the recesses 103 are formed in the relay terminal 101 is described above, the electronic module 100 according to the present embodiment is not limited to such a configuration. A configuration is also possible in which the relay terminal 101 is provided with one protrusion or a plurality of protrusions that are arranged in the up-down direction, and sliding is prevented as a result of the wide portions 614 catching on the protrusions.

Portions similar to those in Embodiment 1 are denoted with the same reference numerals as those used in Embodiment 1, and a detailed description thereof is omitted.

The disclosed embodiments are illustrative examples in all aspects and should not be considered as restrictive. The scope of the present disclosure is defined not by the above descriptions but by the claims, and is intended to encompass all modifications within the meanings and scope that are equivalent to the claims.

What is claimed is:

1. An electronic module for a vehicle, comprising:
   a casing that includes a first plate portion to which an electronic component is to be attached and a second plate portion that is located opposite to the first plate portion;
   an attachment recess that is provided in the first plate portion and to which the electronic component is to be attached;
   an engagement hole that is formed in the attachment recess and is configured to engage with an engagement claw of the electronic component; and
   a bus bar configured to be electrically connected to a terminal of the electronic component that is inserted into the casing,
   wherein the bus bar is movable together with the electronic component in an opposing direction in which the first plate portion and the second plate portion are located opposite to each other; and
   wherein, in a state in which the electronic component is in contact with a bottom of the attachment recess, a distance between the engagement claw of the electronic component and an edge of the engagement hole in the opposing direction is equal to or smaller than a movable distance of the bus bar.

2. The electronic module according to claim 1, wherein the movable distance of the bus bar is 1 to 1.3 times the distance between the engagement claw of the electronic component and the engagement hole.

3. The electronic module according to claim 1, wherein the bus bar includes one end portion that has a U-shape and pinches the terminal of the electronic component.

4. The electronic module according to claim 3, wherein the one end portion of the bus bar includes a protruding portion that comes into contact with the terminal of the electronic component, and the terminal of the electronic component has a recess or a protrusion.

* * * * *